United States Patent [19]
Marro

[11] Patent Number: 6,119,333
[45] Date of Patent: Sep. 19, 2000

[54] MINI-MODULE WITH UPWARDLY DIRECTED LEADS

[75] Inventor: Len Marro, Poquott, N.Y.

[73] Assignee: ILC Data Device Corporation, Bohemia, N.Y.

[21] Appl. No.: 09/081,753

[22] Filed: May 20, 1998

Related U.S. Application Data

[62] Division of application No. 08/889,932, Jul. 10, 1997.
[51] Int. Cl.[7] .................................................. H01R 43/00
[52] U.S. Cl. ................................ 29/825; 29/832; 29/841; 29/412; 29/416; 174/16.3; 174/52.4
[58] Field of Search ............................. 29/825, 832, 840, 29/841, 412, 416; 174/16.3, 52.4

[56] References Cited

U.S. PATENT DOCUMENTS

| | | | |
|---|---|---|---|
| 3,956,698 | 5/1976 | Malmberg et al. | 324/158 R |
| 4,010,760 | 3/1977 | Kraska et al. | 128/419 PS |
| 4,053,833 | 10/1977 | Malmberg et al. | 324/158 R |
| 4,203,066 | 5/1980 | Buck | 324/51 |
| 5,315,520 | 5/1994 | Drake et al. | 364/426.05 |
| 5,371,647 | 12/1994 | Fried et al. | 361/119 |

FOREIGN PATENT DOCUMENTS

| | | |
|---|---|---|
| 0491262A2 | 6/1992 | European Pat. Off. . |
| 0513410A1 | 11/1992 | European Pat. Off. . |
| 07880898A1 | 6/1997 | European Pat. Off. . |

Primary Examiner—Lee Young
Assistant Examiner—Kevin G Vereene
Attorney, Agent, or Firm—Louis Weinstein

[57] ABSTRACT

A power module with leads extending upwardly. The circuit components and connections of the power module are arranged upon a substrate having interface leads attached thereto extending away from the undersurface of the substrate. The interface leads extend through openings in a form fitting molded case. The case has an open center region to facilitate performance of final assembly steps upon the module and is subsequently covered with a rugged lid and is encapsulated with a suitable potting material. The interior of the module is filled with a gel to provide moisture-proof protection.

11 Claims, 4 Drawing Sheets

MINI-MODULE WITH UPWARDLY DIRECTED LEADS

This Application is a divisional of application Ser. No. 08/889,932, filed Jul. 10, 1997.

FIELD OF THE INVENTION

The present invention relates to modules and more particularly to electronic mini-modules in which upwardly directed leads extend from a substrate supporting the circuit components and interconnections, which leads extend through a form-fitting molded case that protects the leads and circuitry during final assembly.

BACKGROUND OF THE INVENTION

Electronic circuits are normally provided with electrical leads extending outwardly from one or more edges of the perimeter thereof. Integrated circuits have been provided with leads extending outwardly therefrom and which are then bent downwardly, typically providing a dual, in-line configuration for the electrical leads.

Modular power units for driving motors and the like are employed in a variety of applications such as industrial and military applications and commercial and military aviation. For example, modular power circuits are utilized to drive motors and other devices employed in robotic devices and systems, and aircraft applications, both military and commercial, military weapons and the like, as well as a variety of other industrial applications. Power driver circuits are typically required to provide outputs of significant voltage and current ratings requiring output energy levels which generates a significant amount of heat.

Such power circuits require provision of an adequate heat sink, which is capable of conducting heat away from the power circuit to prevent overheating and assure proper operation. An adequate heat sink typically requires that a large, intimate contact surface area be provided between the power circuit and the heat sink. As a result, it is important to provide a power circuit design which, in addition to providing adequate heat transfer away from the power circuit, provides conductive interface leads which are suitably removed from and do not interfere with the heat transfer surface to facilitate and simplify interconnection with the devices and or circuits driven by the power circuit.

It is therefore desirable to have a module in which the leads extending outwardly from the substrate are directed away from the heat sink and to provide a module which is easy to assemble and is adequately protected from the severe ambient conditions encountered in use.

BRIEF DESCRIPTION OF THE INVENTION

The present invention is characterized by comprising a module and a method for making a module in which the leads extending transversely from the module substrate pass through a form-fitting molded case which has an open center to facilitate the performance of final manufacturing steps and which is later encapsulated with a potting material.

The substrate is provided with insulating supports along at least one perimeter for supporting upwardly directed, vertically aligned leads. A molded case is provided with a recess along the bottom surface thereof for receiving the substrate so that, when the substrate is mounted therein, the under surface of the substrate protrudes from the under surface of the molded case which borders the substrate on at least two sides thereof.

The molded case is provided with openings of a size and configuration, each of which conform to one of the upwardly directed vertically aligned leads which extend therethrough when the molded case is fitted on to the substrate.

The molded case is provided with opposed mounting surfaces for mounting the module upon a mating surface of a heat sink. Integral bracing portions joined between the mounting surfaces and the main body portion of the case provide enhanced structural strength and assure intimate contact between the undersurface of the substrate and the mating surface of the heat sink.

The central opening in the molded case facilitates the performance of final assembly steps, which opening is filled with a suitable potting material when the assembly steps are completed, yelding a compact module of enhanced structural strength and having conductive interface leads directed away from the heat transfer interface to facilitate connection with associated circuitry which does not interfere with the heat transfer interface, and which is adequately protected from being damaged, even in the severe environment in which the module is employed.

OBJECTS OF THE INVENTION

It is therefore one object of the present invention to provide a novel module having an upwardly directed, vertically aligned connecting leads.

Still another object of the present invention is to provide a novel module comprised of a substrate and a cooperating molded case, the substrate having upwardly directed leads which extend into cooperating openings in the form-fitted molded case.

Still another object of the present invention is to provide a module of the type described in which the molded case is provided with a central opening to facilitate subsequent assembly steps, which opening is filmed with a suitable potting material upon completion of the assembly steps.

Another object of the present invention is to provide a module designed to provide superior contact with a heat sink to assure excellent heat transfer away from the electronic circuitry.

BRIEF DESCRIPTION OF THE FIGURES

The above, as well as other objects of the present invention, will become apparent when reading the accompanying description and drawing in which.

DETAILED DESCRIPTION OF THE INVENTION AND PREFERRED EMBODIMENTS THEREOF

Figure 1:
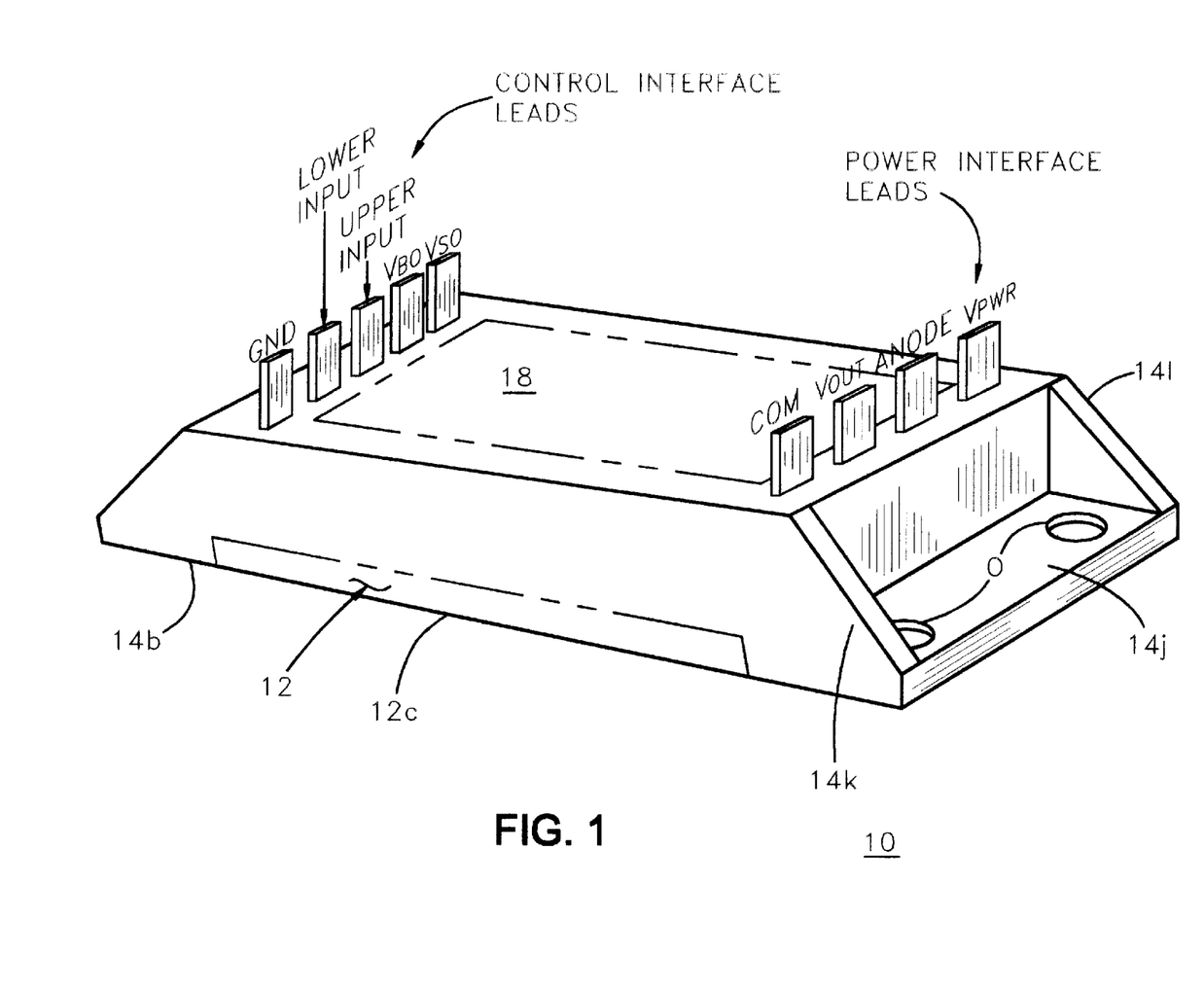
FIG. 1 is a perspective view showing a module embodying the principles of the present invention.
Figure 2:
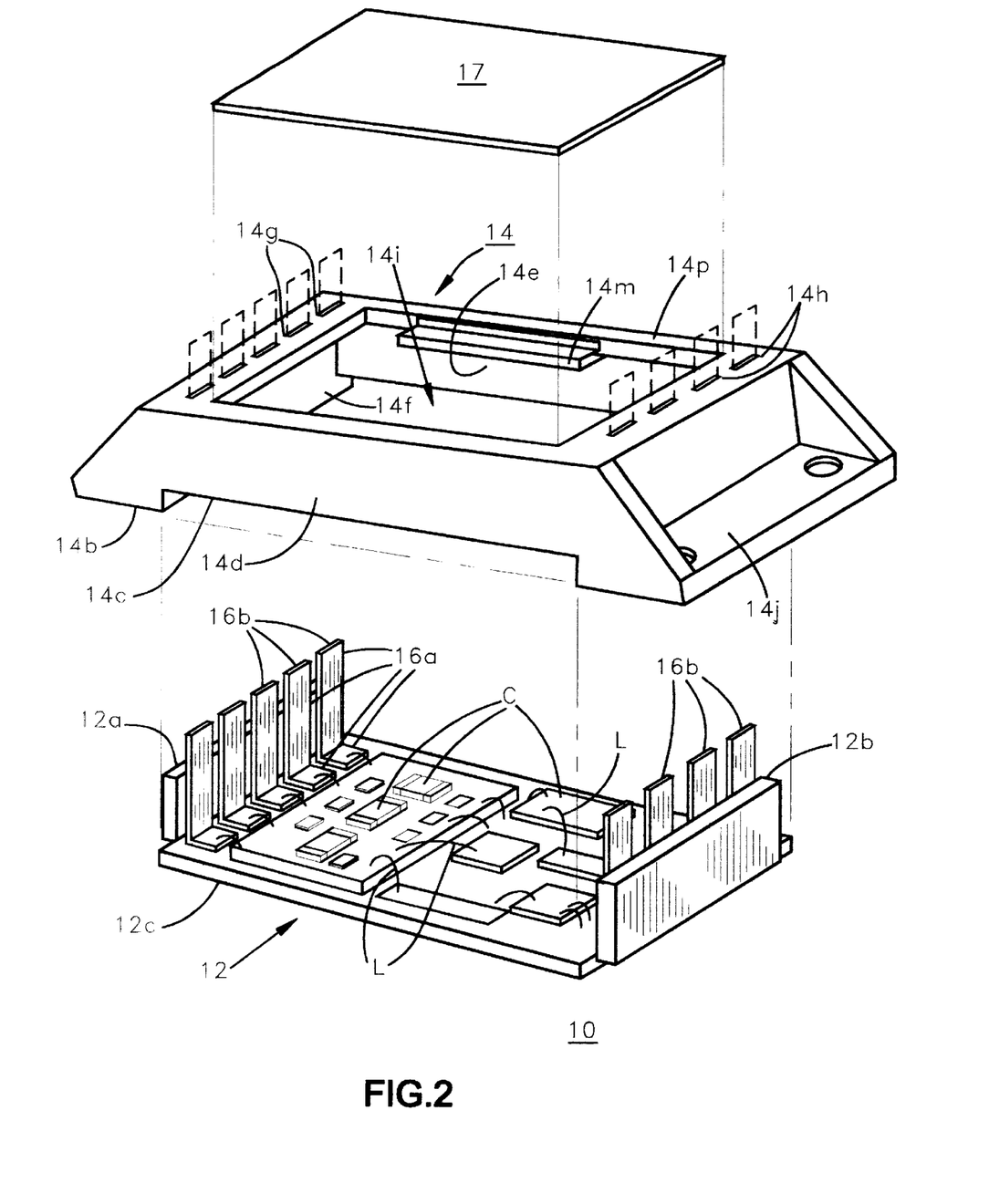
FIG. 2 is a perspective view showing the major components of the module of FIG. 1 in exploded fashion.
Figure 4:
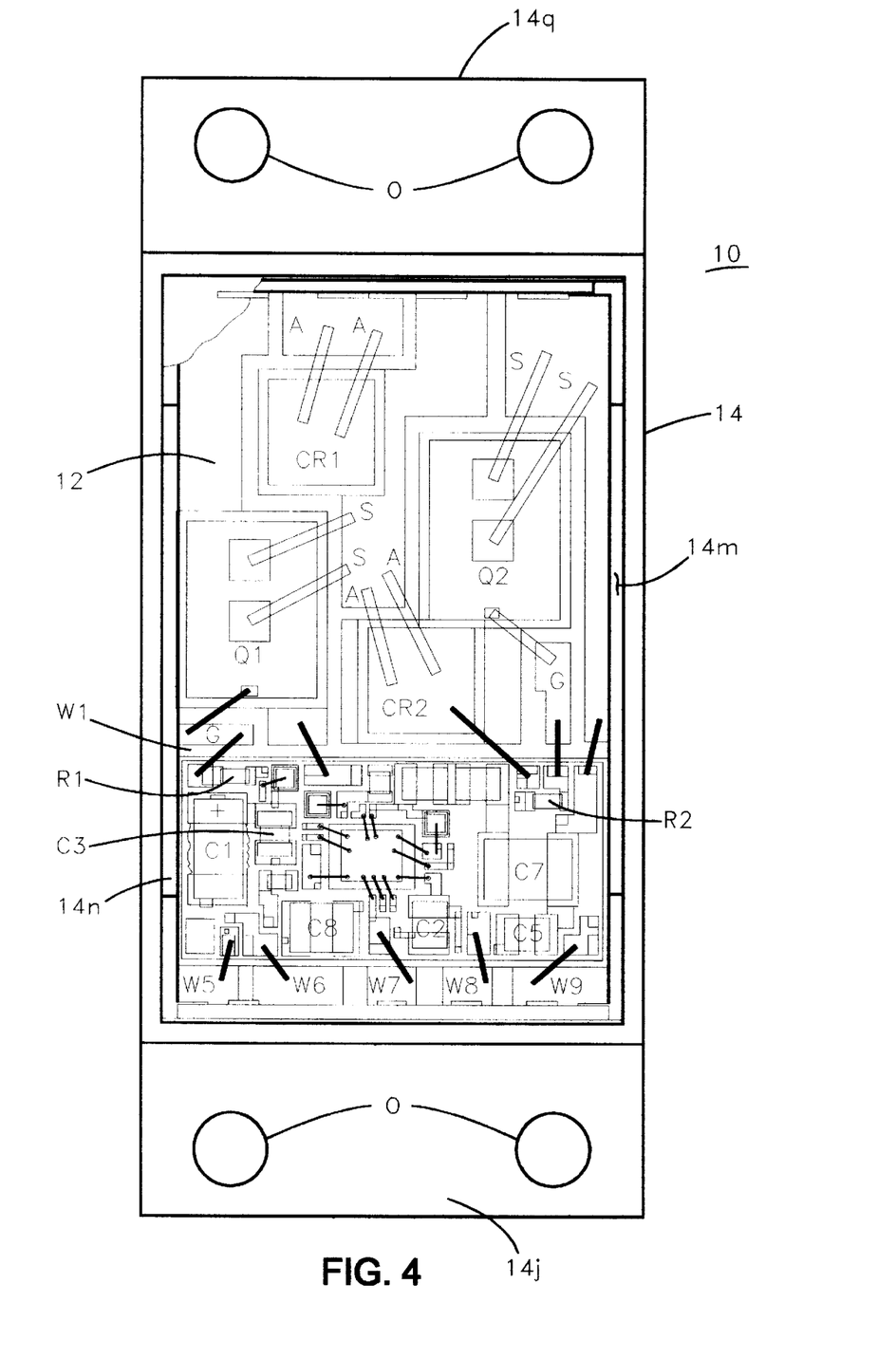
FIG. 4 is a plan view of the module of FIG. 1 prior to sealing of the opening in the molded case and showing the circuitry arranged on the substrate.

FIGS. 1, 2 and 4 show a module 10 comprised of a substrate 12 and a molded, form-fitting case 14. Substrate 12 is a suitable insulating substrate having mounted thereon electronic components C of various types, which components are electrically connected by connecting leads such as the leads L. The circuitry is preferably a power module, in one preferred embodiment, and is employed to provide suitable (and significant) driving power to a motor.

The opposite left and right-hand ends of the substrate 12 are each provided with an array of conductors 16, the lower portions 16a thereof being arranged along the top surface of substrate 12 and bent upwardly to form vertically aligned interface leads 16b.

A lower portion of the vertically aligned interface leads are supported by vertically aligned substrate portions 12a, 12b which are elongated in a direction transverse to the vertically aligned leads 16b. The portions 12a, 12b have been broken away from the main body portion of the substrate 12, as will be more fully described.

Molded case 14 is provided with a substantially rectangular-shaped recess 14c provided along the underside 14b thereof. The substrate 12 fits into recess 14c so that the under surface 12c of substrate 12 projects downwardly from the under surface 14b of molded case 14 by a given distance. The elongated sides 14d, 14e are spaced apart by a distance sufficient to receive the insulating substrate portions 12a, 12b supporting leads 16b so that the left-hand surface of substrate portion 12a rests against interior surface 14f of molded case 14. The right-hand surface of insulating support member 12b rests against a similar surface (not shown in FIG. 2) arranged near the right-hand end of case 14. In the event that portions 12a, 12b extend diagonally outward, the interior surfaces of the molded case 14, such as surface 14f, bring the portions 12a, 12b into proper alignment as the substrate is guided into the molded case.

Molded case 14 is provided with a plurality of slots 14g and 14h arranged in a linear array at the left and right-hand ends of case 14, said slots being substantially similar in shape and slightly larger in size than the interface leads 16b. The interface leads 16b each extend upwardly through an associated one of the slots 14g, 14h, as shown in dotted fashion in FIG. 2 and as shown in solid line fashion in FIG. 1, when the molded case is fitted over the substrate 12 so that the substrate 12 has its bottom surface 12c substantially flush with the bottom surface 14b of case 14, as shown in FIG. 1.

Molded case 14 is provided with a central opening 14i, permitting final assembly steps to be performed subsequent to assembling the substrate 12 and molded case 14 to one another to form the compact module shown in FIG. 1. After completion of the assembly steps, central opening 14i is filled with a suitable potting material. A label or other indicia may be screened onto the surface 18 of the potting material.

Opposite ends of the molded case are provided with mounting surfaces such as the mounting surface 14j, shown in FIGS. 1 and 2. Each mounting surface is provided with suitable openings O receiving fastening members, such as, for example, threaded fasteners. Although not shown in FIGS. 1 and 2, it should be understood that a mounting surface similar to that shown at 14j of FIGS. 1 and 2 is provided at the left-hand end of the molded case.

Substantially triangular-shaped walls 14k, 14l integral with the molded case enhance the structural strength of the mounting portions of the molded case.

The upper surface of the molded case may be provided with suitable indicia for identifying each of the interface leads, if desired.

The procedural steps for producing a power module of the type shown in FIGS. 1–4 are as follows:

The substrate 12 preferably comprises a ceramic substrate supporting the circuit components C and interconnections L therebetween and which is provided with interface leads 16 which comprise copper leads preferably kinetically bonded to the ceramic substrate 12 so that the cooper enters into the interstices of the ceramic material forming substrate 12. The leads are originally arranged along the planar surface of substrate 12.

The ceramic substrate portions 12a and 12b are formed and bent to assume an upright position by pulsing the under surface of ceramic substrate 12 with a laser, forming a "break line" in the ceramic substrate. The laser is pulsed so that the break line does not reach the upper surface of the substrate 12. After the circuitry on substrate 12 has been tested and approved, the ceramic portions 12a and 12b are moved from a horizontal orientation to the vertical orientation shown in FIG. 2, causing the ceramic portions 12a and 12b, which originally lie in a horizontal plane, to break away from the main body portion of the substrate 12 while retaining the integrity of the kinetic bonding of the copper to the ceramic portions 12a and 12b.

The molded case 14 is then positioned above the substrate. The upper ends of the interface leads 16b are guided into the slots 14g and 14h provided in the molded case. The outer surfaces of ceramic portions 12a and 12b are guided along interior end surfaces of the molded case.

Recess 14c is spaced from the bottom surface 12b of molded case 14 so that the substrate 12 projects outwardly from undersurface 14b, preferably by a distance of the order of 0.050 inches.

The continuity of the copper interface leads is assured due to the kinetic bonding between the interface leads and the ceramic substrate. After the substrate assembly and molded case are assembled to one another in the manner shown in FIG. 1, a highly viscous thixotropic adhesive is applied through the upper open end 14i of molded case 14 and is administered in the region where the rectangular-shaped marginal portion of the upper surface of substrate 12 engages the interior side surfaces of the molded case, such as the side surfaces 14e and 14f shown in FIG. 2. The thixotropic adhesive has the unique property of retaining its shape and thus remains in the region where it is applied and does not spread to other regions.

Thereafter, the interior of the assembly 10 is filled with an ultra pure silica gel to a level which reaches the bottom of the case ledge 14k. The gel is a clear material and is applied in such a manner as to be free of any air bubbles, voids or separations. The clear gel allows observation of the circuitry of which it covers even after being filled to the bottom of ledge 14k. The nature of the gel is that it never dries, i.e. it remains as a gel. The gel assumes the shape and contour of the circuitry topology on the top surface of substrate 12 and adheres to the exposed surface providing an excellent, moisture-proof seal. The nature of the silica gel is such that it retains its characteristics and gel state over a wide temperature range of the order of −65° C. to +100° C. Such temperature ranges are routinely encountered in aircraft applications wherein the upper temperature extreme is normally encountered at times prior to and during take-off while the lower temperature extreme is normally encountered in flight.

Figure 3:
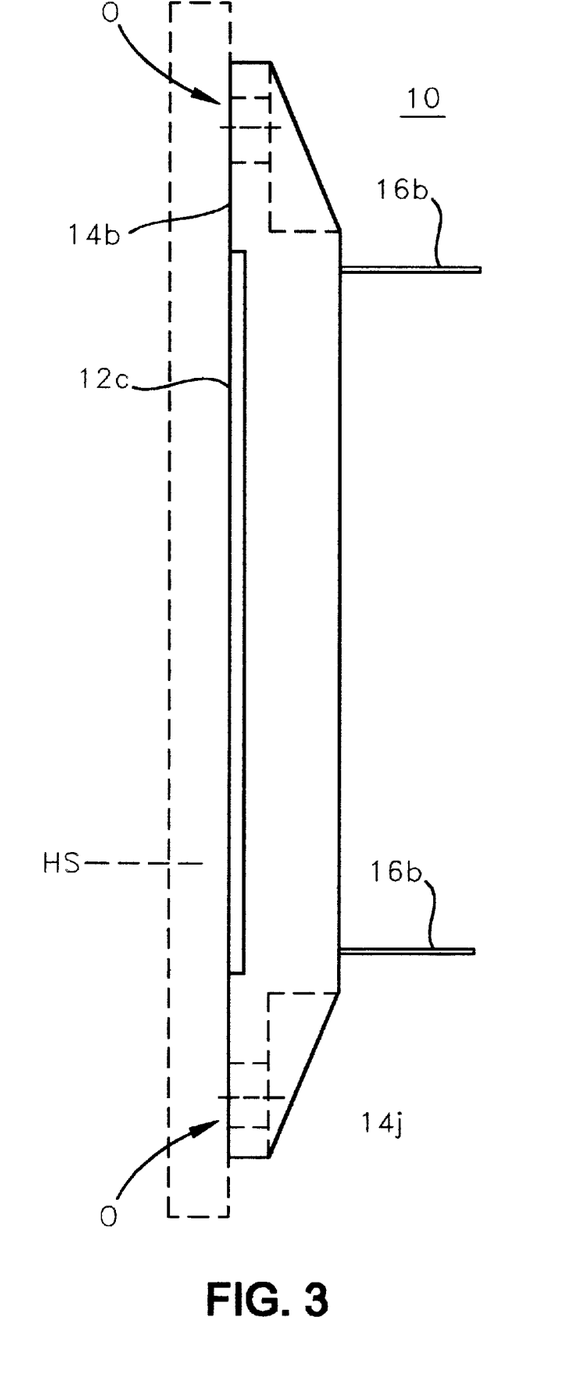
FIG. 3 is a side elevation of the module of FIG. 1.

The opening 14i is covered with a rectangular lid 17 which is formed of a hard, strong plastic (preferably litan). The long sides of the lid 17 rest upon the outwardly projecting ledges provided along the long sides of opening 14i, FIG. 2 shows ledge 14m and FIG. 3 shows ledges 14m and 14n.

The thickness of the lid 17 and the distance between the supporting surface of ledge 14m from the top surface 14p is such that the top surface of lid 17 sits below the top surface 14p of molded case 14, defining a rectangular-shaped recess.

This recess is filled with a potting material such a hard pot, which may be firmly pressed downwardly to assure that the potting material is suitably compacted. The hard, strong plastic lid 17 is designed to withstand the application of pressure during the compacting of the hard pot as well as the application of a force upon the module during testing, installation and use. Thus, the application of a force on the hard pot will not harm either the silica gel or the circuitry.

The assembled power module is placed upon a suitable heat sink HS, typically a conductive material having a high heat conductivity and having a large surface area for conducting heat away from substrate 12, and is firmly secured thereto by suitable fasteners, such as threaded fasteners which are inserted through the openings O on the mounting ledges 14j, 14q. The protrusion of the under side of substrate 12 from the bottom surface 14b of molded case 14 assures that, as the fastening members are adequately tightened, the bottom surface of substrate 12 makes intimate, uniform contact with the upper, mating surface of the heat sink. The mating surface of the heat sink is of a desired flatness to assure good, intimate contact. The molded case 14 has been found to bend slightly as the bottom surface of the ceramic substrate 12 is firmly and strongly urged against the mating surface of the heat sink. The triangular-shaped, integral, reinforcement portions 14k and 14l provided at each end of the molded case enhance the structural strength of the case to assure that the downward forces applied to the molded case by the fastening means as they are tightened are positively transferred to the substrate 12 through the body of the molded case. The molded case 14 is formed of a suitable plastic material which is capable of experiencing bending when it is firmly secured to a heat sink without breaking.

The undersurfaces of the molded case mounting ledges 14j and 14q do not touch the mating surface of the heat sink, which encourages the bending of the ledges 14j, 14q as the fastening members are tightened and assures positive transfer of the downward forces applied by the fastening members to the mounting ledges to the substrate 12 through the main body of the case 14.

The power module 10 is thus provided with a large heat sink to assure good heat transfer away from the circuitry while providing interface leads which are isolated from and which do not interfere with the heat sink and vice versa.

A circuit or device to be interfaced with the power module may be provided with openings through a substrate for receiving the vertically aligned interface leads.

Alternatively, the interface leads may be bent downwardly toward a substantially horizontal orientation to accommodate other type of electrical connection.

The provision of a heat sink interface along one surface and electrical interface leads along an opposite surface provides a power module with excellent heat transfer while providing power module which has a small "foot print". In instances where it is desired to drive a brush type motor, two power modules similar to module 10 may be arranged side-by-side and appropriately electrically interconnected. In the event that it is desired to drive three phase motors, three power modules similar to module 10 may be arranged in side-by-side fashion for driving a three phase, brushless motor.

The arrangement of the present invention provides a module which facilitates mounting of electronic circuitry directly upon the module, thus providing a stackable arrangement having a "foot print" which may be no greater than the "foot print" of the module 10.

A latitude of modification, change and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein described.

What is claimed is:

1. A method for producing a lower circuit module comprising a circuit having components and conductive layers thereof surface of an insulating substrate having first and second ends and a molded case open on both the bottom and the top thereof, and a cover lid, comprising the steps of:
   (a) mounting components and conductive layers on said one surface of said substrate to form a power circuit module;
   (b) forming a break line spaced inward from one end of said substrate along a bottom surface of the substrate opposite said one surface upon which the components are mounted, said break line penetrating only partially through said substrate, said break line being closer to one of said first and second ends dividing said substrate into a main body portion and an end portion, said main body portion having a length greater than a length of said end portion;
   (c) moving said end portion relative to said main body portion causing the end portion to break along said break line and be substantially separated from a remaining portion of the substrate whereas conductive layers bridging the break line are bent along the break line;
   (d) orienting the end portion so that it is substantially perpendicular to said main body portion;
   (e) inserting said end portion through an open end of the molded case so as to be received in a recess provided in said molded case, said end portion resting against an interior side surface of said molded case provided at one end thereof and supporting conductive layers formed thereon;
   (f) adhesively joining the substrate to the molded case through the application of an adhesive through the open upper end of the molded case, said adhesive being applied to join a marginal portion of the substrate to adjacent surfaces of said molded case;
   (g) filling an interior in the molded case so as to cover said one surface and said circuit on the substrate with a gel;
   (h) placing said lid upon ledges provided at least on opposite sides of the molded case to cover said upper opening; and
   (i) filling, a recess defined by the upper exposed surface of said lid and the marginal sides of the upper opening in said molded case with a potting material.

2. The method of claim 1 wherein step (f) includes utilizing a thixotropic adhesive to adhere the molded case to the substrate.

3. The method of claim 1 wherein step (g) further comprises utilizing a clear, silica gel to cover said mounting surface and the circuitry thereon.

4. The method of claim 1 wherein step (g) further includes filling the interior of the molded case to a level just below said edges.

5. The method of claim 1 wherein step (g) further includes the step of inserting the gel in such a manner as to be free of air bubbles, void and separations.

6. The method of claim 1 wherein step (g) further comprises utilizing a clear, silica gel to fill the interior of the molded case.

7. The method of claim 1 further comprising affixing the molded case to a heat sink.

8. The method of claim 1 further comprising placing the bottom surface of the substrate upon a mating surface of a heat sink; and fastening the molded case to the heat sink to urge the bottom surface of the substrate into intimate engagement with the mating surface of the heat sink.

9. The method of claim 4 wherein the molded case is affixed to the heat sink by means of fasteners mounted through fastener receiving openings in mounting ledges provided at opposite ends of the molded case and firmly securing the fastening members to the heat sink.

10. The method of claim 1 wherein step (b) includes forming said substrate from a ceramic material.

11. The method of claim 10 further comprising kinetically bonding copper leads to the ceramic substrate.

* * * * *

UNITED STATES PATENT AND TRADEMARK OFFICE
CERTIFICATE OF CORRECTION

PATENT NO. : 6,119,333
DATED : September 19, 2000
INVENTOR(S) : Len Marro

It is certified that error appears in the above-identified patent and that said Letters Patent is hereby corrected as shown below:

Claim 1, Column 6,
Line 7, delete "lower" and insert --power--.
Line 7, after "thereof" insert --mounted upon one--.
Line 48, change "Filling," to --Filling--.

Claim 5, Column 6,
Line 62, change "void" to --voids--.

Signed and Sealed this

Nineteenth Day of June, 2001

*Attest:*

NICHOLAS P. GODICI
*Attesting Officer*   *Acting Director of the United States Patent and Trademark Office*

UNITED STATES PATENT AND TRADEMARK OFFICE
CERTIFICATE OF CORRECTION

PATENT NO. : 6,119,333
DATED : September 19, 2000
INVENTOR(S) : Marro

It is certified that error appears in the above-identified patent and that said Letters Patent is hereby corrected as shown below:

<u>Title page,</u>
Line 73, after the word "Assignee", delete "ILC Data Device Corporation, Bohemia, N.Y.", and insert therefor -- Data Device Corporation, Bohemia, N.Y. --

Signed and Sealed this

Fourth Day of December, 2001

Attest:

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO.    : 6,119,333
DATED         : September 19, 2000
INVENTOR(S)   : Len Marro Page 1 of 1

It is certified that error appears in the above-identified patent and that said Letters Patent is hereby corrected as shown below:

<u>Column 6, claim 1,</u>
Line 9, after "thereof" insert -- mounted upon one --.
Line 7, delete "mounted upon one" which was inserted after the word "thereof", previously performed in a Certificate of Correction dated June 19, 2001.

This certificate supersedes Certificate of Correction issued June 19, 2001

Signed and Sealed this

Second Day of April, 2002

*Attest:*

JAMES E. ROGAN
*Director of the United States Patent and Trademark Office*

*Attesting Officer*